United States Patent
Landers et al.

(10) Patent No.: US 6,291,833 B2
(45) Date of Patent: *Sep. 18, 2001

(54) APPARATUS FOR MAPPING SCRATCHES IN AN OXIDE FILM

(75) Inventors: William Francis Landers, Wappingers Falls, NY (US); Jyothi Singh, Houston, TX (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/464,486

(22) Filed: Dec. 15, 1999

Related U.S. Application Data

(62) Division of application No. 08/959,217, filed on Oct. 28, 1997, now Pat. No. 6,048,745.

(51) Int. Cl.[7] .................................................. H01L 23/58
(52) U.S. Cl. ............................................. 257/48; 257/10
(58) Field of Search ............................... 438/16, 401, 14, 438/11, 15, 18; 430/312, 313, 314, 316, 317; 257/48, 10

(56) References Cited

U.S. PATENT DOCUMENTS

| 4,586,822 | * | 5/1986 | Tanimoto | 356/394 |
| 4,626,101 | | 12/1986 | Ogawa et al. | 356/237 |
| 5,381,234 | | 1/1995 | Barbee et al. | 356/369 |
| 5,635,335 | * | 6/1997 | Bae et al. | 430/312 |
| 5,667,941 | * | 9/1997 | Okamoto et al. | 430/313 |
| 5,811,223 | * | 9/1998 | Bae | 430/312 |
| 5,817,445 | * | 10/1998 | Bae | 430/312 |
| 5,821,131 | * | 10/1998 | Bae | 438/16 |

FOREIGN PATENT DOCUMENTS

| 6007129 | 1/1985 | (JP) . |
| 6313756 | 11/1994 | (JP) . |

\* cited by examiner

*Primary Examiner*—Olik Chaudhuri
*Assistant Examiner*—Alonzo Chambliss
(74) *Attorney, Agent, or Firm*—Ratner & Prestia; Jay H. Anderson, Esq.

(57) ABSTRACT

A method and apparatus for detecting scratches on a wafer surface. The method comprises the use of a monitor wafer which has a substrate, a first layer deposited on the substrate, and a second layer deposited on the first layer. The first and second layers have contrasting work functions such that when short wavelength light is directed on the monitor wafer, scratches through the second layer can be detected.

4 Claims, 1 Drawing Sheet

APPARATUS FOR MAPPING SCRATCHES IN AN OXIDE FILM

This application is a divisional of U.S. patent application Ser. No. 08/959,745, filed on Oct. 28, 1997, now U.S. Pat. No. 6,048,745.

BACKGROUND OF THE INVENTION

1. Field of the Invention

The invention relates to a method for detecting scratches on a film surface. More particularly, the invention relates to a method and apparatus for mapping scratches on a surface layer of a semiconductor wafer, such as an oxide film, which may occur during processing of the wafer.

2. Related Art

During the processing of semiconductor wafers, there is usually a step involving polishing or planarizing the surface of the wafer. This polishing or planarizing step often causes scratches on the wafer surface. It is important that the location, size, and depth of these scratches be identified early before they become problematic. For instance, replicated scratches can fill with residual metal in subsequent processing steps.

In the past, the inspection process was accomplished visually by a skilled person. In many instances, however, these scratches are very small and difficult to identify with the naked eye. In particular, integrated circuits have recently been excessively miniaturized in size, and surface scratches which occur could be only 1 µm or less in size. Obviously, such small scratches are impossible to identify with the naked eye.

In order to overcome the inadequacies of visual inspection, methods have been developed for improved of scratches on a wafer surface. One method entails detecting scratches on a wafer surface by scattering light onto the wafer surface (see U.S. Pat. No. 4,626,101). Although effective in some instances, this technique inherently is not effective for defect detection on certain wafer surfaces such as oxide or nitride. Oxide and nitride are just some of the common films used as a stop layer for the polishing process of semiconductor wafers. With the use of known light scattering techniques, it is very difficult to detect scratches in oxide and nitride.

Accordingly, recent attempts have been made to better detect defects on oxide and nitride layers. For example, International Business Machines Corporation has developed a technique whereby scratch detection is based on using a highlighting wet etch process involving three wet steps to highlight the scratches (IBM Technical Disclosure Bulletin, vol. 34, No. 4B, September, 1991). The highlighting steps are followed by conventional light scattering to detect the scratches. This process is time-consuming and potentially contaminating due to the wet steps.

Therefore, there is a need for a simple and more efficient method of scratch detection on wafer surfaces, and in particular, on surface layers comprising nitride or oxide.

SUMMARY OF THE INVENTION

To meet this and other needs, and in view of its purposes, the present invention provides a method and a monitor wafer used for detecting scratches on a film surface. The method includes the first step of providing a monitor wafer which has a substrate, a first layer with a first work function deposited on the substrate, and a second with a surface and a second work function deposited on the first layer. The method also includes the second step of exposing the wafer to light. The invention further provides a monitor wafer which has a substrate, a first layer with a first work function deposited on the substrate, and a second layer with a surface and a second work function deposited on the first layer. It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DESCRIPTION OF THE PREFERRED EMBODIMENT(S)

The method of the invention effectively detects scratches which may occur during planarization or polishing of semiconductor wafer surfaces. For example, during the polishing of wafer surfaces, the polishing pad will eventually become abrasive due to build up of material through use. This abrasive build-up will cause scratches in wafer surface which could be problematic. As such, the use of a monitor wafer in accordance with the invention can allow for early detection of scratches and thus avoidance of problematic chips.

The method of the invention is based on the detection of contrasting work functions. A monitor wafer is provided having at least two blanket layers, of different work function, formed on a substrate. For example, the upper layer has a high work function while the lower layer has a low work function. The term ※ work function ※ is used in this application to indicate the energy required to eject an electron from the surface of a given material. Photoelectrons are emitted when the energy, hυ (where h, Planck's constant, is a fundamental constant of nature with the value h=6.63× $10^{-34}$ kg m²/s and υ is the frequency of the light), of a quantum of light exceeds the work function of the surface of the material.

In particular, photoemission of electrons will occur from a low work function surface when light of short wavelength, λ, such as ultraviolet (UV) light, is directed on that surface. Accordingly, when the upper layer of the monitor wafer has a high work function and is scratched through to the lower, low work function layer, photoemission of electrons will occur only from the lower layer. This allows more effective visualization of a scratch. The use of this process considerably improves the detection sensitivity for scratches in oxide and nitride layers. In addition, a significant feature of the invention is that the disclosed method does not require the time-consuming, and potentially contaminating, wet process presently used in the prior art, thereby saving processing time and remaining compatible with future wafer processing.

Figure 1:
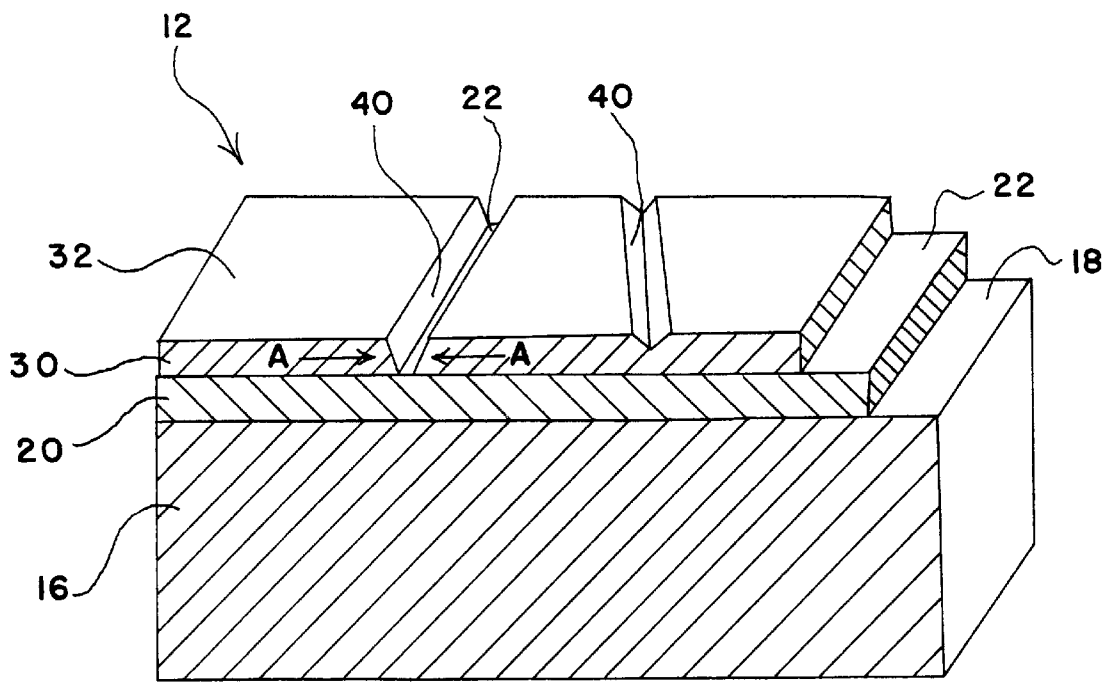
FIG. 1 is a cutaway view of a monitor wafer of the present invention with a scratched upper surface.

Referring now to the drawing, wherein like reference numerals refer to like elements throughout, FIG. 1 shows a portion of a monitor wafer 12 in accordance with the present invention. The monitor wafer 12 comprises a substrate 16 having a surface 18. Deposited on the surface 18 of the substrate 16 is a lower layer 20 having a surface 22. Finally, deposited on the surface 22 of the lower layer 20 is an upper layer 30 having a surface 32. Also shown in FIG. 1 are scratches 40 in the upper layer 30 of the monitor wafer 12.

Figure 2:
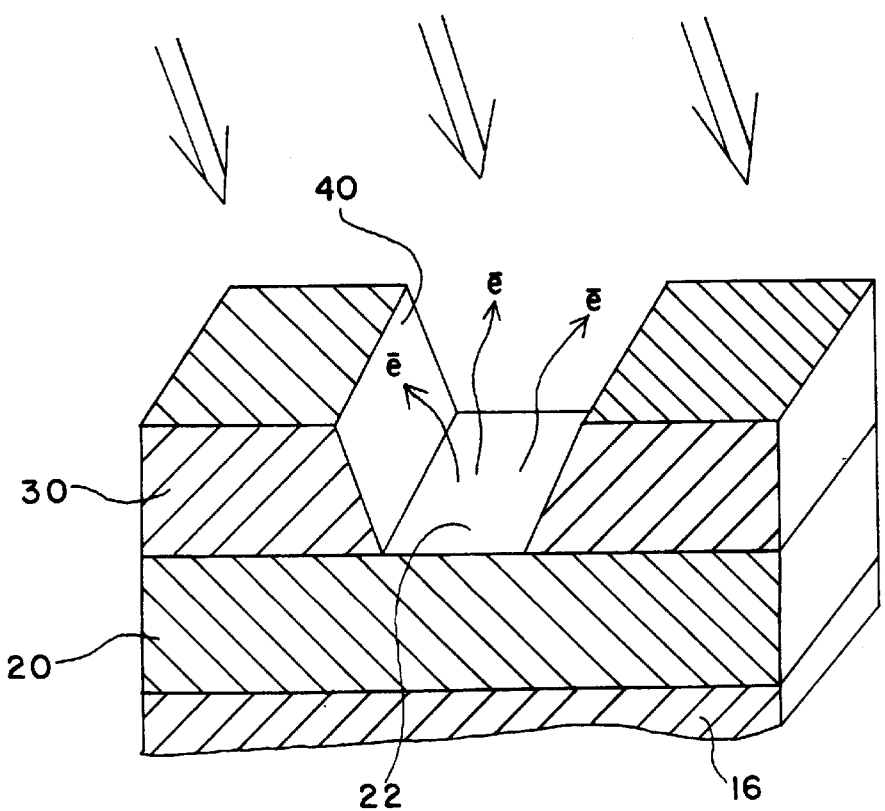
FIG. 2 is an expanded view of the section between arrows ※ A ※ of FIG. 1 illustrating electron photoejection from the lower layer.

Layers 20 and 30 are comprised of contrasting work function material. In particular, it is preferred that the upper layer 30 have a work function with sufficient contrast versus the work function of the lower layer 20 to result in a noticeable difference in photoelectron emission when a short wavelength light is directed on the layers (see FIG. 2). The upper layer 30 of the monitor wafer 12 preferably comprises the material of interest.

In a preferred embodiment, the material of interest has a high work function. As such, the lower layer 20 will comprise a material having a low work function. Oxide and nitride are two examples of high work function materials commonly used in the semiconductor industry. Suitable contrasting low work function materials, which are compatible with semiconductor manufacturing processes, include metals such as Al, Cu, W, and Ti and alloys of such metals. These metals have work functions of about 4 to 5 eV, which are adequate for high photoejection at short light wavelengths. Such a low work function is significantly contrasting to the work function of oxide and nitride to be effective in the method of the invention. These low work function materials are chosen not only for their high photoejection efficiency, but also because of their ease of and for material compatibility with both the substrate 16 and the upper layer 30.

When short wavelength light is shown on monitor wafer 12 comprising the embodiment just described, scratches 40 which extend through to the lower layer 20 will be imaged as bright regions in a dark background. It is preferred, in this embodiment, that the light wavelengths are in the range of 2,700 to 2,000 Å. This range of wavelength will cause photoejection from the metals listed above, but not from oxide or nitride.

In an alternate embodiment, the upper layer 30 comprises a low work function material such as polysilicon or metal. In such a case, the lower layer 20 will comprise a high work function material such as oxide or nitride. In this case, when short wavelength light is shown on the monitor wafer 12, the scratches 40 which reach the lower layer 20 will be imaged as dark regions in a bright background.

The substrate 16 on which these layers are deposited can comprise any substrate material which is compatible with the lower layer 20. In the case of semiconductor wafers, the substrate 16 preferably comprises silicon for simplicity and ease of handling, although it can comprise any other suitable material onto which the two layers can be deposited such as, for example, UV quartz.

An important feature of the invention is the ability to pre-set the thickness of upper layer 30. In particular, the thickness of the upper layer 30 can be pre-set in order to determine whether scratches 40 are so deep as to become problematic. In the case of semiconductor wafers, by careful choice of thickness of the upper layer 30, it is possible to identify whether scratches 40 are which are greater than a certain depth which is found by experience to correspond to yield loss or quality degradation of the wafers. For instance, a scratch of more than 500 Å may be determined to damage the wafer. Therefore, the upper layer 30 of the monitor wafer 12 should be equal to or slightly thicker than 500 Å.

In operation, a monitor wafer 12 is prepared in accordance with the invention (for purposes of this explanation, the upper layer 30 has a high work function while the lower layer 20 has a low work function). The monitor wafer 12 is then put through the polishing or planarizing step in order to determine how much scratching occurs. The monitor wafer 12 is then subjected to short wavelength light. A scratch through the upper layer 30 which exposes the lower layer 20 will result in photoejection of electrons (see FIG. 2). In particular, the photoelectron ejection threshold is exceeded for only one of the two layers (i.e., the lower layer 20) for which the energy of the incident photon exceeds its work function. The ejected photoelectrons are then imaged using electron optics such as that used in Photoelectron Microscopes (PEM) to produce a map of the through scratches in the region imaged. In this embodiment, in which the upper layer 30 comprises a high work function material such as oxide, the scratches 40 would be imaged as bright marks in a dark field. In the opposite embodiment, wherein the upper layer 30 comprises the low work function material, the scratches 40 would be imaged as dark marks in a bright field.

As is well known in the art of photo-electron emission, the source of the short wavelength light can be adjusted for a sharper image. For example, use of a laser of suitable wavelength (e.g., an eximer laser) instead of a diffuse source for the illumination would result in increased signal-to-noise ratio due to a more focused source increased brightness. Other techniques such as pulsing the light source and biasing may be used to increase the signal-to-noise ratio as well. If the substrate 16 is a UV transparent material such as quartz, the UV illumination can be accomplished from the backside of the substrate 16, although front side illumination is preferred.

It is possible to get a resolution of less than 0.1 microns in the photoelectron image. Typically, the field of view is a few millimeters on the side. This is compatible, therefore, with the need to detect scratches down to about 0.1 microns in diameter.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A monitor wafer comprising:
   a substrate;
   a first layer, having a first work function, deposited on the substrate; and
   a second layer, having a surface and a second work function, deposited on the first layer and entirely covering the first layer except for defects in the second layer which are scratches in the second layer extending to the first layer, the first work function and the second work function are in contrast to result in a noticeable difference in photoelectron emission when a light is directed on the layers, and thereby allows for visualization of the defects, wherein the second layer is of a thickness so as to visualize the defects in the second layer that are damaging to the wafer.

2. The monitor wafer of claim 1 wherein the first layer has a low work function and the second layer has a high work function.

3. The monitor wafer of claim 1 wherein the second layer is one of nitride and oxide.

4. The monitor wafer of claim 1 wherein the first layer has a high work function and the second layer has a low work function.

* * * * *

UNITED STATES PATENT AND TRADEMARK OFFICE
CERTIFICATE OF CORRECTION

PATENT NO. : 6,291,833 B2
DATED : September 18, 2001
INVENTOR(S) : William Francis Landers and Jyothi Singh It is certified that error appears in the above-identified patent and that said Letters Patent is hereby corrected as shown below:

Column 1,
Line 34, insert the word -- identification -- after the word "improved";

Column 2,
Line 22, delete the ❋ A ❋ and insert -- "A" --; and

Line 43, delete ❋ work function ❋ and insert -- "work function" --.

Signed and Sealed this

Eighth Day of October, 2002

*Attest:*

*Attesting Officer*

JAMES E. ROGAN
*Director of the United States Patent and Trademark Office*